United States Patent
Lunz et al.

(10) Patent No.: US 10,030,825 B2
(45) Date of Patent: Jul. 24, 2018

(54) LIGHTING ASSEMBLY WITH AN OPTICAL ELEMENT FOR REDUCING COLOR OVER ANGLE VARIATION

(71) Applicant: PHILIPS LIGHTING HOLDING B.V., Eindhoven (NL)

(72) Inventors: Manuela Lunz, Eindhoven (NL); Rifat Ata Mustafa Hikmet, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 114 days.

(21) Appl. No.: 15/190,546

(22) Filed: Jun. 23, 2016

(65) Prior Publication Data

US 2017/0038015 A1 Feb. 9, 2017

(30) Foreign Application Priority Data

Aug. 3, 2015 (EP) .................................... 15179474

(51) Int. Cl.
*F21K 9/62* (2016.01)
*H01L 33/58* (2010.01)
(Continued)

(52) U.S. Cl.
CPC .................. *F21K 9/62* (2016.08); *F21K 9/64* (2016.08); *F21V 7/0025* (2013.01); *F21V 7/22* (2013.01);
(Continued)

(58) Field of Classification Search
CPC ..... F21K 9/62; F21K 9/68; F21K 9/69; H01L 33/60; G02F 2001/133607; G02B 5/02; G02B 5/0205; F21V 11/06
(Continued)

(56) References Cited

U.S. PATENT DOCUMENTS 2,298,556 A * 10/1942 Foss ........................ F21V 11/06
  362/343
3,124,311 A 3/1964 Kruger
(Continued)

FOREIGN PATENT DOCUMENTS

DE 102006061175 A1 6/2008
GB 697728 A 9/1953
(Continued)

OTHER PUBLICATIONS

Huang, Hsin-Tao et al, "Planar Lighting System Using Array of Blue LEDs to Excite Yellow Remote Phosphor Film", Journal of Display Technology, vol. 7, No. 1, Jan. 2011, pp. 44-51.

*Primary Examiner* — Anh Mai
*Assistant Examiner* — Steven Horikoshi

(57) ABSTRACT

A lighting assembly (100), a lamp, a luminaire, a manufacturing method and a manufacturing control program are provided. The lighting assembly comprises a light source (110) and an optical element (120). The light source comprises a solid state light emitter (112) and a luminescent element (114). The solid state light emitter is arranged to emit light of a first color into the luminescent element. The luminescent element comprises a light emission window (115) through which the light is emitted. The optical element is arranged for reducing a color over angle variation of the light emitted by the light emission window of the luminescent element. The optical element comprises a light input face, a light output face and at a plurality of locations a light transmitting wall (122) extending from the light input face to the light output face.

12 Claims, 8 Drawing Sheets

(51) Int. Cl.

| | |
|---|---|
| *F21K 9/64* | (2016.01) |
| *F21V 7/00* | (2006.01) |
| *F21V 7/22* | (2018.01) |
| *F21V 11/06* | (2006.01) |
| *H01L 33/50* | (2010.01) |
| *H01L 33/60* | (2010.01) |
| *F21Y 115/00* | (2016.01) |

(52) U.S. Cl.
CPC .............. *F21V 11/06* (2013.01); *H01L 33/58* (2013.01); *F21Y 2115/00* (2016.08); *H01L 33/505* (2013.01); *H01L 33/60* (2013.01); *H01L 2933/0091* (2013.01)

(58) Field of Classification Search
USPC ....................................................... 362/465
See application file for complete search history.

(56) References Cited

U.S. PATENT DOCUMENTS

2006/0221612 A1* 10/2006 Song ................. G02F 1/133603
 362/247
2010/0072488 A1 3/2010 Bierhuizen et al.
2012/0106155 A1* 5/2012 Hata ....................... F21V 11/06
 362/249.02

FOREIGN PATENT DOCUMENTS

| WO | 2012140579 A2 | 10/2012 |
| WO | 2013118037 A1 | 8/2013 |
| WO | 2014191250 A1 | 12/2014 |

\* cited by examiner 800
802

820

840

860

LIGHTING ASSEMBLY WITH AN OPTICAL ELEMENT FOR REDUCING COLOR OVER ANGLE VARIATION

FIELD OF THE INVENTION

The invention relates to a lighting assembly.
The invention further relates to a lamp and a luminaire.
The invention also relates to a manufacturing method to manufacture an optical element for use in the lighting assembly and a manufacturing control program.

BACKGROUND OF THE INVENTION

Published US patent application US2010/0072488A1 describes a Light Emitting Diode (LED) which emits light into a phosphor layer. The phosphor layer converts a portion of the light emitted by the LED to obtain a relatively white light emission. However, the color of the emitted light at different light emission angles varies, in other words, there is a significant color over angle variation. In the embodiments of the cited document, the height and/or the width of the phosphor layer are well controlled to control the color over angle. In the discussed embodiment, the width and height of the phosphor layer are controlled to control the amount of emitted blueish white light at relatively low light emission angles and the amount of emitted yellowish white light at relatively large light emission angles. Subsequently the cited patent document proposes to use a reflector or lens to correct for the color over angle variation to obtain a light emission that has a relatively uniform color at all light emission angles.

SUMMARY OF THE INVENTION

It is an object of the invention to provide a phosphor converted light source that has an improved color over angle profile.

For this purpose, according to an aspect of the invention, a lighting assembly is provided. The lighting assembly comprises a light source and an optical element. The light source comprises a solid state light emitter and a luminescent element. The solid state light emitter is arranged to emit light of a first color into the luminescent element. The luminescent element comprises luminescent material for absorbing a portion of the light of the first color and for converting a portion of the absorbed light towards light of a second color. The luminescent element comprises a light emission window through which the light of the first color and/or the second color is emitted. The optical element is arranged for reducing a color over angle variation of the light emitted by the light emission window of the luminescent element. The optical element comprises a light input face, a light output face and at a plurality of locations a light transmitting wall extending from the light input face to the light output face. The light input face faces the light emission window of the luminescent element for receiving light emitted by the luminescent element. The light output face is arranged opposite to the light input face for emitting transmitted light into an ambient of the lighting assembly.

Between the walls of the optical element a portion of the received light can be transmitted without being hindered by walls. In particular, light which has light emission angles that are about parallel to the walls shall not impinge on the walls. Light with light rays that have larger light emission angles impinges on the light transmitting walls. Light transmitting walls allow the transmission of most light impinging on the walls. At every transition from one medium to another medium, it is almost impossible to prevent any reflection of light, even when the angles at which the light rays impinge on the transition surface are smaller than the critical angle of the transition surface. Although the surface of the walls may look relatively flat, seen at the micro level there may be some roughness and, consequently, the walls may also reflect some light rays impinging at an angle smaller than the critical angle. Thus, an (limited) amount of light rays are reflected by the walls, while also a portion of the light rays are transmitted to an area behind the wall. Subsequently, after the transmission through the wall the light rays may impinge on the light transmitting wall at another location, where, again, an (limited) amount of transmitted light rays may be reflected, while also a portion of it is transmitted to the other side of the wall, etc. In particular the light rays that are reflected at the surface of the walls may be reflected in a (slightly) different direction. Because a portion of the light rays at larger light emission angles are reflected at the walls, the different colors of light emitted at different light emission angles are better mixed. In other words, a portion of the light emitted at larger light emission angle is reflected such that it becomes light with a different light emission angle and, thus, the light emitted at larger angles is better mixed with the light emitted at smaller angles. Thereby the variations in the color of the emitted light at different light emission angles is reduced. Thus, the optical element enhances the color over angle profile of the light source. It is to be noted that the term light emission angle (for a specific light ray) is defined by an angle between the specific light ray and a (virtual) line perpendicular to the light emission window.

The optical element has at a first side the light input face. The first side is arranged at such a position that (most of) the light emitted by the light emission window of the luminescent element is received by the light input face. The light input face faces the light emission window. The light input face may be in contact with the light emission window or, alternatively, a gap may be present between the light emission window and the light input face (for example, to prevent that heat is transferred from the luminescent element towards the optical element). The space between the light transmitting wall at the different locations may comprise a medium, for example a transparent gas. The light input face and the light face may be open and, thus, in contact with the ambient. Consequently, one may be assumed that the space between the light transmitting wall at the different locations are filled with the air, or a specific other gas that is present in the ambient of the lighting assembly. The light transmitting wall may have a uniform thickness, but may also have a different thickness at different locations.

Optionally, the optical element comprises a channel structure wherein light transmitting channel walls enclose channels, a first end of the channels are arranged at the light input face and a second opposite end of the channels are arranged a the light output face. The channels walls together from the wall at different locations. The channels may be arranged adjacent to each other and are separated by the channel walls. Such a channel structure is a relatively (mechanically) strong structure and it is relatively easy to manufacture such channel structures.

The lighting assembly comprising the above discussed channel structure can be defined by: A lighting assembly comprising a) a light source comprising a solid state light emitter and a luminescent element, the solid state light emitter being arranged to emit light of a first color into the luminescent element, the luminescent element comprising luminescent material for absorbing a portion of the light of the first color and for converting a portion of the absorbed light towards light of a second color, the luminescent element comprising a light emission window through which the light of the first color and/or the second color is emitted, and b) an optical element arranged for reducing a color over angle variation of the light emitted by the light emission window of the luminescent element, the optical element comprising a channel structure wherein light transmitting walls enclose channels, a first end of the channels are light input windows receiving light from the light emission window and a second opposite end of the channels are light output windows for emitting transmitted light into an ambient of the lighting assembly.

Optionally, the light transmitting wall at the plurality of locations is formed by a spiraling wall that has a cross-sectional shape of a spiral in a plane parallel to the light input face or to the light output face. An optical element with a spiraling wall can be manufactured relatively easy because only one elongated wall element must be used which is subsequently arranged in the spiral shape.

Optionally, said walls at the plurality of locations are made of a transparent material. In particular when a transparent material is used, a limited amount of light rays (having a light emission angle smaller than the critical angle) are reflected by the walls. The inventors have found that only a small portion of the light has to be reflected to reduce variations in the color of the emitted light at different light emission angles. Thus, the transparent material provides an enhanced color over angle profile, while preventing the unnecessary absorption of light (thereby preventing too large efficiency reductions) and preventing a too large collimation of the light as emitted at the light emission surface.

Optionally, said walls at the plurality of locations are arranged to reflect in between 5% and 20% of the light that impinges on the walls. The materials of the walls and the structure of the walls influence how much of the light is reflected. In particular transparent walls have often this amount of reflection. It is to be noted that the walls are light transmitting, and, thus, it is assumed that (also taking into account a limited amount of absorption of light), that at least 70% of the impinging light is transmitted through the light transmitting walls, and that, optionally, at least 80% of the impinging light is transmitted through the light transmitting walls. Optionally, the walls reflect in between 5% and 10% of the light that impinges on the walls.

Optionally, a surface of said walls that extends from the light input face to the light output face has a relief. A slight relief of the walls contributes to the reflection of light that impinges on the wall. Thereby a better mixing of light is obtained and a more uniform color output is obtained. The relief could be formed by a rough surface or a regularly undulating surface. The relief may be formed by, for example, etching or because of a rough structure of a mold in which the walls are formed. Another manufacturing technology resulting in a limited relief is discussed hereinafter. The relief can also be a periodic structure formed, by, or example protrusions having the shape of half a diamond, or half a sphere. Optionally the relief being formed by ribs, i.e. ridges, extending in planes about parallel to the light input face or light output face. Optionally, a cross-sectional shape of the ribs is triangular, sinusoidal, curved or rectangular.

Optionally, a surface of said walls at the plurality of locations has a structure being the result of an additive manufacturing technology. In an additive manufacture technology, the manufactured objects are build up by adding a layer on top of a previously manufactured layer. 3d printing is an example of such a technology. By adding layers on top of previously manufactured layers, the structure of the side walls is a pattern of repeating ribs, i.e. ridges or lines. Periodicity of the ribs may be in the range from 2 to 500 micrometer, or, optionally, in the range from 50 to 200 micrometer. An average surface amplitude of the ribs (which is the average distance between maxima and minima of the ribs measured in a direction perpendicular to the surface of the wall) may be in the range from 1 to 50 micrometer, or, optionally, in the range from 3 to 30 micrometer.

Optionally, the walls comprise at least one of the subsequent materials: said walls at the plurality of locations comprise at least one of the subsequent materials, or blends and copolymers of the subsequent materials: a polyolefin such as for example polypropylene (PP), a polyester such as for example Polyethylene terephthalate (PET), an acrylate such as for example Poly(methyl methacrylate) (PMMA), a polycarbonate (PC) such as for example bisphenol-A polycarbonate, polystyrene, Acrylonitrile butadiene styrene (ABS), polylactic acid.

The walls are not necessarily made of only one of the above discussed materials. A mix of materials may also be possible, or some of the walls may be made of one materials and other walls are made of other materials. The material of the walls may also comprise some additional substances.

Optionally, a cross-sectional shapes of the channels are selected from: a triangle, a square, a rectangle, a circle, an ellipse or a polygon having multiple equal angles and/or multiple equal edges. Examples of polygons having multiple equal angles and multiple edges of an equal length are, for example, pentagons, hexagons, heptagons, octagons, etc. It is not necessary that each channel has the same cross-sectional shape, different shapes may be mixed in the optical element to obtain the best uniform color output at different light emission angles. When all channels have a square, rectangular or a hexagonal cross-sectional shape, all channels can be arranged directly adjacent neighboring channels and they have only to be separated by thin walls which results in an efficient use of space and a relatively large photo efficiency.

Optionally, said walls at the plurality of locations have a height that is defined as a shortest distance from the light input face to the light output face, wherein the heights are in a range from 0.5 to 5.5 mm, or, optionally, the heights of the channels are in a range from 0.8 to 1.2 mm. When the optical element has channels: each channel has a width, the width is defined in radial direction of the channel and is a shortest distance from a point on said channel wall towards an opposite point on said channel wall, wherein the width of the channels are in a range from 0.4 to 3.5 mm. Optionally, the width of the channels are in a range from 1.8 to 2.2 mm.

The inventors have found that channels have such heights and widths provide an advantageous reduction of variations in the color over angle, while maintaining an efficiency of the optical element and preventing a too large collimation of light.

Optionally, when the optical element comprises channels, a ratio between the height and the width of the channels is in a range from 1.65 to 2.3. The inventors have found that aspect ratios in this interval provide an advantageous color over angle variation reduction without introducing too many other side-effects like efficiency reduction and too much collimation.

Optionally, a size of the optical element measured in a direction perpendicular to the longitudinal direction of the channels, is equal to or larger than a size of the light emission window of the luminescent element. If the optical element is large enough, it is capable to receive all light emitted through the light emission window and reducing the color over angle variation in the whole light beam emitted by light source.

Optionally, the lighting assembly comprises at least three channels.

According to another aspect of the invention, a lamp is provided that comprises a lighting assembly according to one of the above discussed embodiments.

According to a further aspect of the invention, a luminaire is provided that comprises a lighting assembly according to one of the above discussed embodiments or that comprises the above discussed lamp.

According to an aspect of the invention, a manufacturing method to manufacture an optical element for use in the lighting assembly of the above discussed embodiments is provided. The optical element being arranged for reducing a color over angle variation of the light emitted by the light emission window of the luminescent element. The optical element comprising a light input face, a light output face and at a plurality of locations a light transmitting wall extending from the light input face to the light output face. The manufacturing method is based on additive manufacture and comprises i) depositing with an additive manufacturing apparatus a first layer of the wall at the different locations, wherein a light transmitting material is deposited, ii) depositing with the additive manufacturing apparatus a subsequent layer of the walls of the optical element on top of a previously deposited layer, wherein the light transmitting material is deposited and the depositing of the subsequent layer is repeated until a predefined height of the wall is reached and consequently the optical element is obtained, the height being measured along the wall along a shortest path from the light input face towards the light output face. It is to be noted that, in an embodiment, one may read 3d printing instead of additive manufacturing.

According to a further aspect of the invention, a manufacturing control program that comprises comprising instructions is provided. The program is operative to cause an additive manufacturing apparatus to perform the previously discussed manufacturing method. The manufacturing control program may be a computer program that may be executed by a computer that controls the additive manufacturing apparatus. It is to be noted that, in an embodiment, one may read 3d printing instead of additive manufacturing. In an embodiment, the manufacturing control program may be provided on a data carrier, such as a CD, hard disk, USB stick, floppy disk, etc. In an embodiment, the manufacturing control program may also be provided in a memory of a computer or of the additive manufacturing apparatus. In an embodiment, the manufacturing control program may also be provided available for download on a server of a data network such as the internet.

Further preferred embodiments of the device and method according to the invention are given in the appended claims, disclosure of which is incorporated herein by reference.

BRIEF DESCRIPTION OF THE DRAWINGS

These and other aspects of the invention will be apparent from and elucidated further with reference to the embodiments described by way of example in the following description and with reference to the accompanying drawings, in which.

The figures are purely diagrammatic and not drawn to scale. In the Figures, elements which correspond to elements already described may have the same reference numerals.

DETAILED DESCRIPTION OF EMBODIMENTS

Figure 1:
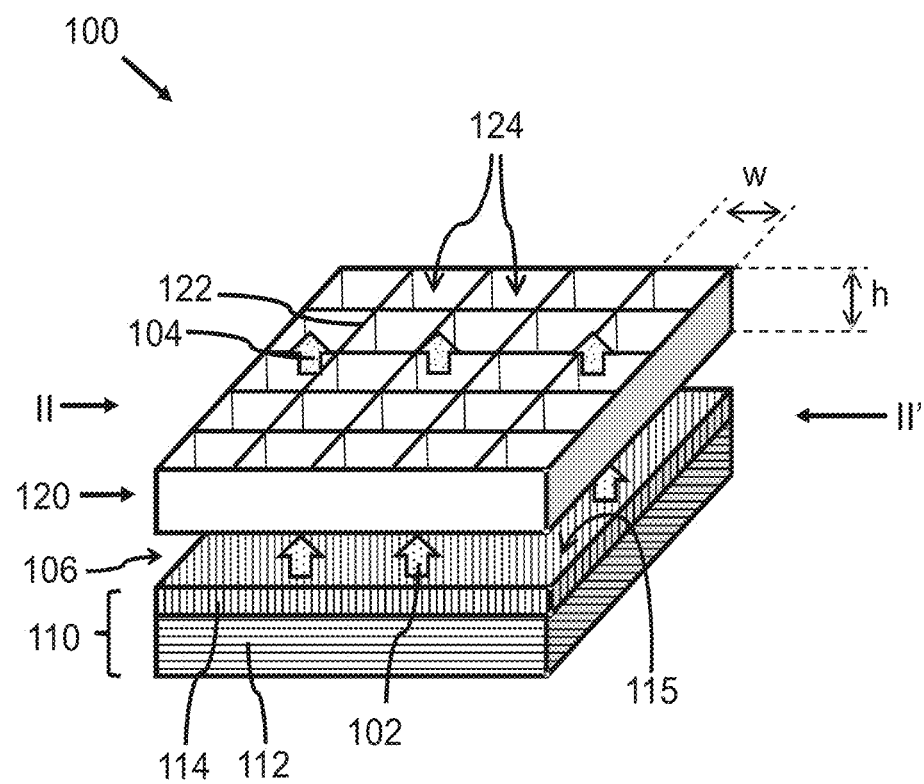
FIG. 1 shows a three dimensional view of an embodiment of a lighting assembly.

FIG. 1 shows a three dimensional view of an embodiment of a lighting assembly 100. The lighting assembly comprises a light source 110 which comprises a solid state light emitter 112 and a luminescent element 114. The solid state light emitter 112 is arranged to emit light towards/into the luminescent element 114. The luminescent element 114 is arranged to receive light from the solid state light emitter 112. In the embodiment of FIG. 1 the luminescent element 114 is provided on a light emitting surface of the solid state light emitter 112. In other embodiments there may be a gap between the solid state light emitter 112 and the luminescent element 114. In FIG. 1 the light emitting surface of the solid state light emitter 112 has a shape of a square. In other embodiment the light emitting surface of the solid state light emitter 112 may have another shape, for example, a circular shape and in such an embodiment the luminescent element 114 may also have another shape, for example, the luminescent element is, for example, disk shaped. The solid state light emitter may be a Light Emitting Diode (LED), a laser diode or an Organic Light Emitting Diode (OLED). It is to be noted that the light source may also comprise a plurality of solid state light emitters that together form a relatively large light emitter. For example, a plurality of solid state light emitters may be arranged in a light mixing chamber and a light exit window of the light mixing chamber is provided with the luminescent element.

The luminescent element 114 comprises luminescent material which absorbs at least a portion of the light emitted by the solid state light emitter 112 and converts at least a portion of the absorbed light towards light of another color. The luminescent element 114 emits light 102 at its light emission window 115, which is a surface of the luminescent element 114 that faces away from the solid state light emitter 112. The light 102 comprises at least the light of the another color and, optionally, also a portion of the light emitted by the solid state light emitter 112. The luminescent element 114 may comprise a single luminescent material, or a mix of luminescent materials. The luminescent material may comprise inorganic phosphors, organic phosphors, quantum dots, quantum rods and/or quantum tetrapods.

The lighting assembly also comprises an optical element 120 which is suitable for reducing a color over angle variation of the light emitted by the light emission window 115 of the luminescent element 114. The optical element 120 comprises a channel structure in which light transmitting walls 122 enclose channels 124. A first side of the channels are light input windows and a second side of the channels 124 are light output windows. The optical element 120 is arranged such that the light input windows receive the light 102 that is emitted along the light exit window 115 of the luminescent element 114. Light 104 with a reduced color over angle variation is emitted through the light exit windows of the channels 124. In the shown orientation of FIG. 1, the top side of the optical element 120 is named the light exit face of the optical element 120, and the side of the optical element 120 that faces directly towards the luminescent element 114 is named the light input face of the optical element 120. The light input windows of the channels 124 are arranged at the light input face of the optical element 120. The light exit windows of the channels 124 are arranged at the light exit face of the optical element 120.

In the example of FIG. 1 the cross-sectional shape of the channels 124 are squares. In other embodiments, the cross-sectional shape of the channels 124 is one of a square, a rectangle, a circle, an ellipse, a pentagon, a hexagon, a heptagon or an octagon. In the example of FIG. 1 all channels 124 have the same size and in other embodiments the sizes of the channels may vary along the optical element 120. The walls 122 of the optical element may be relatively thin and are made of light transmitting material. The walls 122 may have a thickness in a range from 50 to 800 micron or, optionally, in a range from 50 to 400 nm. The walls must be sufficiently thick to manufacture a mechanical stable optical element 120 and, on the other hand, when the walls 122 are too thick the optical efficiency of the optical element 120 may drop too much. Optionally, the walls 112 are transparent. Optionally, the walls comprise at least one of the following materials: polypropylene (PP), Polyethylene terephthalate (PET), Poly(methyl methacrylate) (PMMA) and polycarbonate (PC). In an embodiment, the walls are made of from PET. As will be elucidated in FIG. 2a, the light 104 that exits the optical element 120 has a smaller color over angle variation than the light 102 that enters the optical element 120.

In the example of FIG. 1 there is a gap 106 between the light source 110 and the optical element 120. This may prevent that heat generated in the solid state light emitter 112 and/or in the luminescent element 114 is transferred by means of direct heat conduction towards the optical element 120. This may be advantageous when the material of the optical element 120 may be damaged by to high temperatures. In cases where the solid state light emitter 112 and/or the luminescent element 114 does not become very hot in use, or when the material of the optical element 120 is able to withstand relatively high temperatures, the optical element 120 may be placed directly on the light exit window 115 of the luminescent element 114.

Figure 4A:
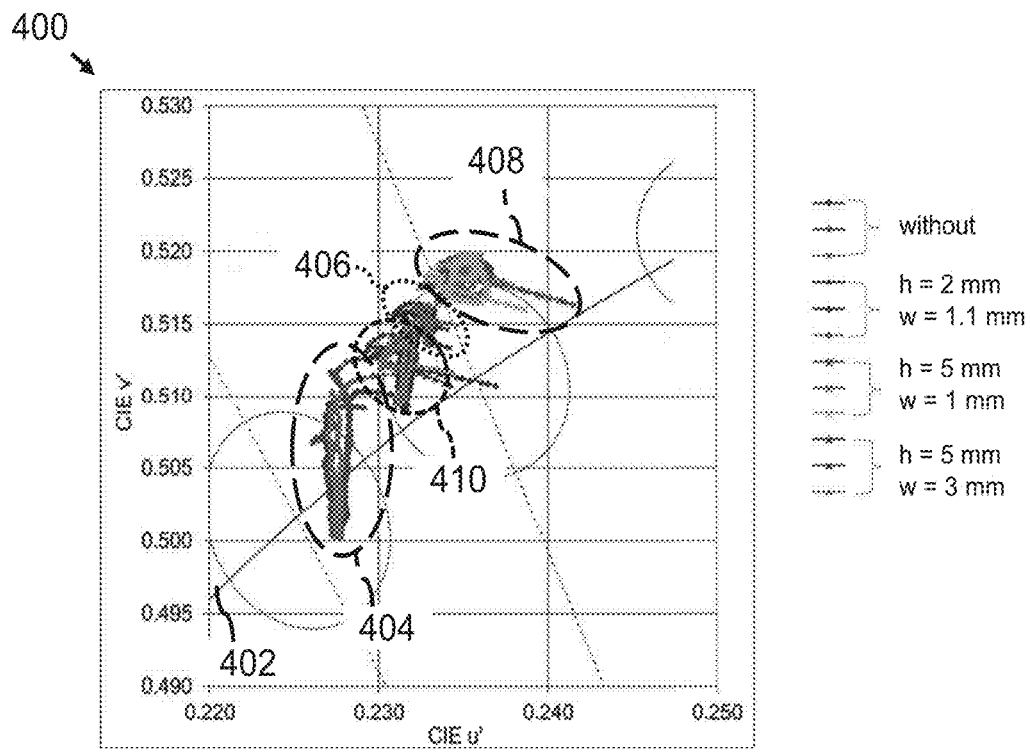
FIG. 4a shows a chart in which measurements of color over angle variations of different embodiments of the lighting assembly are shown.

In FIG. 1 is shown that the channels 124 may have a specific height h, which is measured in the longitudinal direction of the channels 124 and which is defined as the shortest distance from the light input window towards the light output window of the channels 124. The channels have also a specific width w, which is measured in a plane perpendicular to the longitudinal direction of the channels 124 and which is defined as the shortest distance from a point on a wall 122 of the channel 124 towards an opposite point on the wall 122 of the channel 124. Because the channels of FIG. 1 have a square cross-sectional shape, the width w is the length of the edges of the square. In cases of a circular cross-sectional shape, the diameter of the circle is the width w. In cases of a hexagonal cross-sectional shape, the width w is defined by the distance from an edge of the hexagon to an opposite edge of the hexagon. In the context of FIG. 4a, specific embodiments of the widths and heights are discussed. It is also to be noted that in a single optical element different channels with a varying channel width and also a varying channel height may be used to combine specific effects of such varying heights and widths.

Figure 2A:
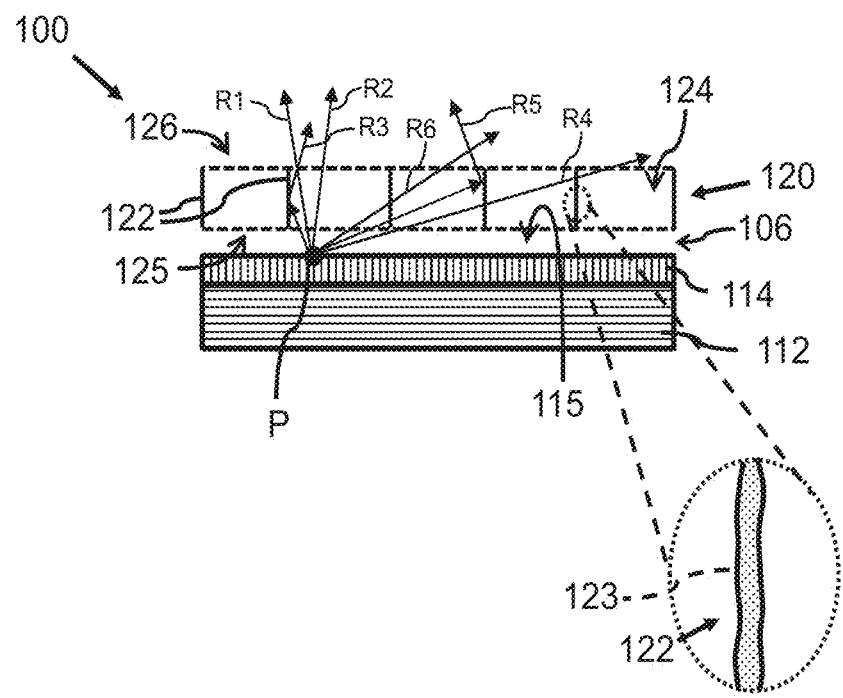
FIG. 2a shows a cross-sectional view of the embodiment of the lighting assembly of FIG. 1 along line

FIG. 2a shows a cross-sectional view of the embodiment of the lighting assembly 100 of FIG. 1 along line II-II'. The cross-sectional view is taken along a plane along line II-II' of FIG. 1 and the plane is arranged perpendicular to the light emitting surface 115. FIG. 2a shows the solid state light emitter 112 with luminescent element 114. A surface of the luminescent element 114 facing away from the solid state light emitter 112 is the light emission window 115 of the luminescent element 114. A plurality of channels 124 of the optical element 120 are shown and it is shown that the channels 124 are separated from each other by walls 122. Each channel 124 has a light input window 125 and a light exit window 126. All light input windows 125 face the light emission window 115 of the luminescent element 114.

To illustrate the reduction of the color over angle variation, in FIG. 2a is drawn a point P at the light emission window 115 of the luminescent element. From this point P several emitted light rays R1 . . . R6 are drawn. A light emission angle of the light rays R1 . . . R6 is determined with respect to a line perpendicular to the light emission window 115 of the luminescent element 114. Light rays R1 . . . R3 have a relatively small light emission angle. Light rays R4 . . . R6 have a relatively large light emission angle.

In an example, the solid state light emitter 112 may emit blue light and the luminescent element 114 may comprise luminescent material for converting a portion of the blue light towards yellow light. In the example, the light emitted through the light emission window 115 is a combination of yellow and blue light and the combination may be experienced as relatively white light by the human naked eye. Thus, the emitted light may have a color point relatively close to the black body/locus line. As discussed in the cited state of the art document US2010/0072488A1, the light emitted at relatively small light emission angles is more bluish white light and the light emitted at the relatively large light emission angles is more yellowish white light.

As seen in FIG. 2a, light rays R1, R2 are directly emitted through the channel without impinging on a wall 122. Light ray R3 impinges on the wall 122 and is reflected. Other light rays R4 . . . R6 also impinge on walls and may be transmitted once or twice through the walls and may be reflected at a wall of another channel. For example, light ray R6 is transmitted through a wall and is not reflected by a wall. Light ray R4 is transmitted through two walls and is not reflected. Light ray R5 is transmitted through one wall and is reflected by a subsequent wall. Because some of the light rays are reflected at the walls 122, the different colors of light emitted at different light emission angles are better mixed. Thereby, seen at the light exit windows of the channels 124, the color of the light emitted at different light emission angles is more uniform than it was at the light emission window 115 of the luminescent element 114.

As discussed, the walls 122 are light transmitting or even transparent. Optionally, the walls 122 reflect at their surface between 5% and 20% of the light that impinges on the walls 122. The inventors have found that such a reflectivity leads to a good reduction of the color over angle variation. Optionally, the walls 122 reflect at their surface between 7% and 9% of the light that impinges on the walls 122. Optionally, the walls 122 reflect at their surface 8% of the light that impinges on the walls 122.

Optionally, the walls 122 are not completely flat, but have a relief at their surface. This relief is limited, but large enough to reflect impinging light in different directions. In FIG. 2a an example is given of such a relief. At the bottom right end of FIG. 2a an enlargement of a portion of a wall 122 is shown. As can be seen, the surface 123 of the wall 122 is slightly curved. Optionally, the optical element 120 may be manufactured with an additive manufacturing technology, such as 3d printing. In additive manufacturing, the structure may be build up in the form of layers. In the context of the optical element 120 it means that the walls 122 are build up by first manufacturing a bottom layer of the wall, manufacturing a layer on top of the previously manufactured layer, etc., until the wall 122 has the correct height. When a transparent material is used, a transparent wall is created and at the surface of the wall ribs, i.e. ridges, and indentations, i.e. valleys, of a limited height/depth may be present. The ribs and indentations extends into a direction perpendicular to the longitudinal direction of the channels 124—in other words: the ribs may extend in planes about parallel to the light input face or light output face, in other words, in a direction perpendicular to the plane of the FIG. 2a and along planes that are parallel to the light input windows and/or light output windows of the channels. Optionally, a cross-sectional shape of the ribs is triangular, sinusoidal, curved or rectangular. Periodicity of the ribs may be in the range from 2 to 500 micrometer, or, optionally, in the range from 50 to 200 micrometer. An average surface amplitude of the ribs (which is the average distance between maxima and minima of the ribs measured in a direction perpendicular to the surface of the wall) may be in the range from 1 to 50 micrometer, or, optionally, in the range from 3 to 30 micrometer.

In the above description of FIG. 1 and FIG. 2a several characteristics of the light source and/or the optical element are discussed. These characteristics may, in so far relevant, also apply to the subsequent embodiment of the lighting assembly and/or the optical element.

Figure 2B:
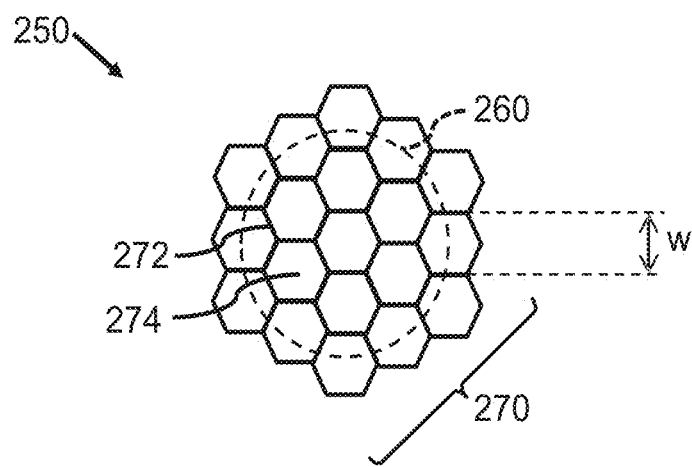
FIG. 2b shows a top view of a further embodiment of a lighting assembly.

FIG. 2b shows a top view of another embodiment of a lighting assembly 250. In the top view, the viewer is looking towards the light exit windows of the channels 274. As such, the light source and the luminescent element are, in the top view, behind the optical element 270. As an example a dashed circle is shown that may represent a circular shaped light source 260 with luminescent element. The luminescent element may also be circular or has another shape such as, for example, a square or hexagonal shape.

The optical element 270 of FIG. 2b is similar to discussed embodiments of the optical element 120 of FIG. 1 and FIG. 2a. A difference is that the channels 274 do not have a square cross-sectional shape, but have a hexagonal cross-sectional shape. Thereby the channels 274 and walls 272 form a honeycomb structure. The square channels 124 of FIG. 1 and FIG. 2a result in different collimation of the light in different directions and thereby, when the light emitted by the lighting assembly impinges on a surface, a somehow square footprint may be obtained. By using hexagonal shaped channels 274, the differences in collimation in different directions are lower and thereby a footprint of the light emitted by the lighting assembly 250 is more circular. Furthermore, the hexagonal channels 274 can efficiently arranged in the honeycomb structure such that no additional spaces between the channels 274 must be filled with relatively thick walls.

Figure 3A:
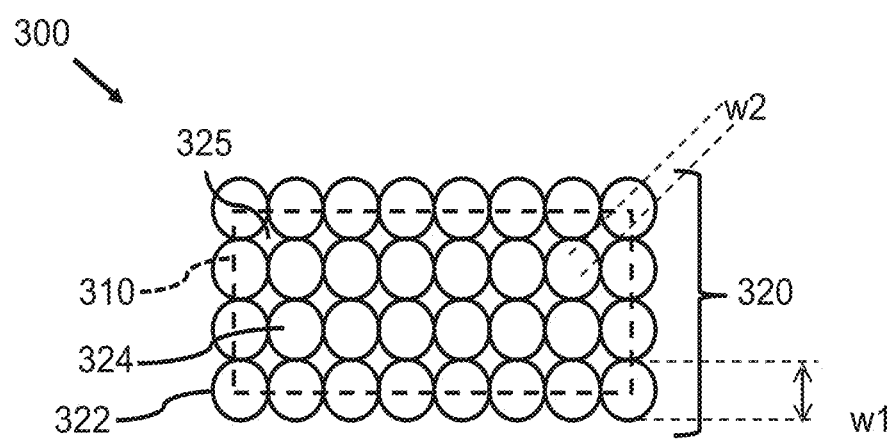
FIG. 3a shows a top view of another embodiment of a lighting assembly.

FIG. 3a shows a top view of another embodiment of a lighting assembly 300. In the top view the viewer is looking towards the light exit face of the optical element 320. The top view shows the optical element 320 which is arranged, for example, in front of a rectangular solid state light emitter 310 with rectangular luminescent element. The channel structure of the optical element 320 is formed by tubular shaped channels 324 of which the walls 322, seen in a cross-sectional view, have a circular shape. The walls 322 of the different tubular shaped channels 324 touch each other and thereby the space in between four neighboring tubular shaped channels 324 forms also a channel 325 of a different cross-sectional shape. As indicated in FIG. 3a, the width w1 of the circular shaped channels 324 is the diameter of the circular shaped channels 324 and the width w2 of the other channels 325 is formed by the shortest distance from a wall 322 of one circular shaped channel 324 towards an opposite wall of another circular shaped channel 324. The optical element 320 may be manufactured by gluing tubular shaped channels together into the channels structure as shown. The optical element 320 may also be manufactured in another way, for example, with an additive manufacturing technology. Other configuration are possible as well, of which FIG. 3b also provides an example.

Figure 3B:
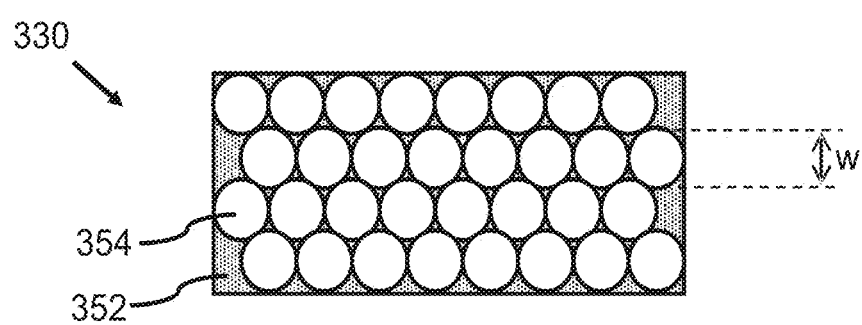
FIG. 3b shows a top view of an embodiment of an optical element.

FIG. 3b shows a top view of an embodiment of an optical element 330. In this optical element 330, tubular shaped channels 354 are provided. The walls 352 completely fill the space in between the tubular shaped channels 354 and as such the thickness of the walls may vary. One may manufacture such an optical element by drilling holes in a light transmitting or transparent plate thereby creating the tubular shaped channels 354. The optical element 330 may also be manufactured in another way, for example, with an additive manufacturing technology.

Figure 3C:
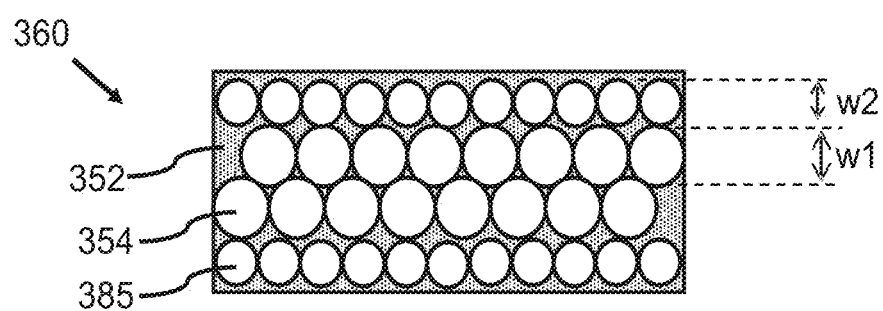
FIG. 3c shows a top view of another embodiment of an optical element.

FIG. 3c shows a top view of another embodiment of an optical element 360. Optical element 360 is similar to optical element 330 of FIG. 3b. A difference is that two rows of tubular shaped channels are replaced by tubular shaped channels 385 having a smaller width w2 than the width w1 of the tubular shaped channels 354 in the two central rows. Channels of different widths may be used to obtain a specific collimation effect, for example, the specific collimation effect is a sum of the two collimation effects of the channels with the different widths.

It is to be noted that one may also use different cross-sectional shapes for different channels, e.g., tubular shaped channels may be combined with channels having a hexagonal cross-sectional shape. Each specific shape influences the shape of the light beam emitted by the lighting assembly in its own way and, thus, by combining different shapes, the light beam emitted by the lighting assembly is a combination of light beam shaping effect. For example, channels of a first cross-sectional shape can be used to compensate for effects of channels of a second cross-sectional shape.

Figure 8A:
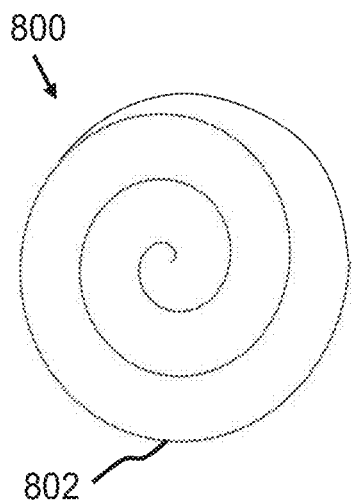
Figure 8B:
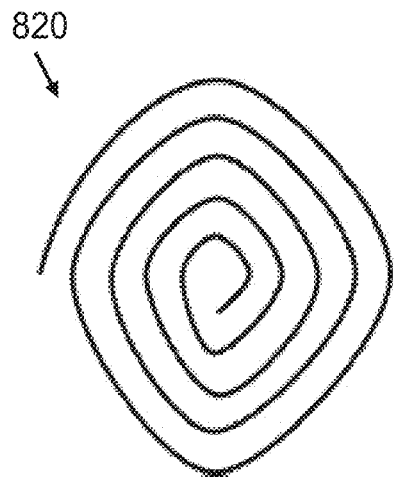
Figure 8C:
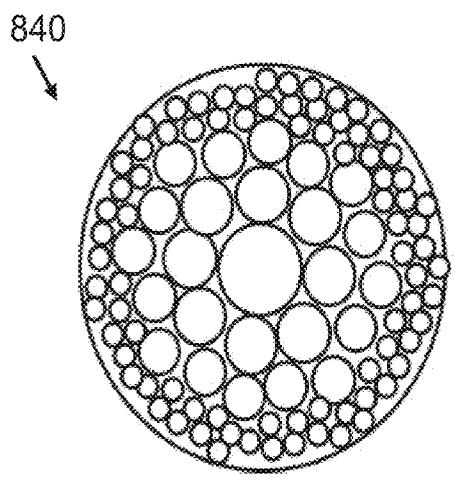
Figure 8D:
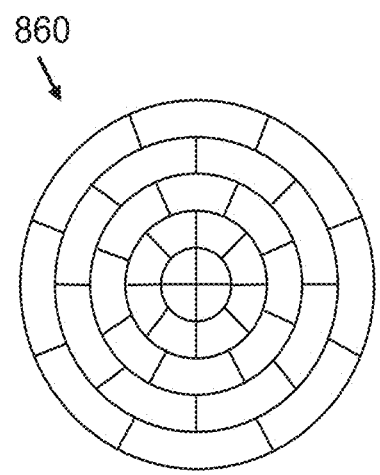

FIGS. 8a to 8d schematically show top view of alternative embodiment of an optical element 800, 820, 840, 860. In FIG. 8a, the optical element 800 has one wall 802 which is arranged as a spiral, as seen in the top view. Because the wall 802 has a spiral shape, at different locations a wall is provided. The basis for the presented spiral is an Archimedean spiral that is, at the end, closed. It is not necessary that the spiral is closed at the end. Other specific spiral arrangements are possible as well, such as, for example, the wall 802 may be arranged according to Fermat's spiral, or a logarithmic spiral. As shown in FIG. 3b, the wall of another optical element 820 may be arranged as a spiral that has a shape in between a perfect Archimedean spiral and a spiral formed by straight lines and 90 degrees corners. FIG. 8c presents a top view of an optical element 840 that has channels of a varying width. In particular the width of the central channels is relatively large and the width of the channels reduce up to the borders of the optical element. The optical element 840 may be built by connecting tubular channels of the required width to each other or by drilling holes of different diameter in a transparent plate. Variations of the embodiment of FIG. 8c may relate to using different channel widths at other locations. FIG. 8d presents an optical element 860 that is formed by a series of walls forming concentric circles as seen in the top view and by a series of walls interposed in between the walls forming the concentric circles. In the optical element 860 channels are formed by spaces in between two walls forming two neighboring concentric circles and two neighboring walls interposed between said neighboring concentric circles. Variations of the embodiment of FIG. 8d may relate to using other numbers of walls in between two walls forming two neighboring concentric circles and varying the distance between the walls forming the concentric circles.

FIG. 4a shows a chart 400 in which measurement of color over angle variations of different embodiments of the lighting assembly is shown. The chart 400 presents a portion of the CIELUV color space. The x-axis represents the CIE u' coordinate and the y-axis represents the CIE v' coordinate. Line 402 represents the black body line/the locus line. The black body line is a series of color points of light emissions of black body radiators each having a different temperature.

The measurements have been obtained for a lighting assembly that has an optical element as shown in FIG. 1. The light source is a so-termed CoB module (Chip on the Board module) which comprises a PCB board on which a plurality of LEDs are provided and on top of which the luminescent element is placed. The LED is electrically coupled to the PCB board and power terminals for receiving power for the LED are provided on the PCB board. The light emitting surface of the luminescent element is circular shaped.

The obtained lighting assemblies are placed in an imaging sphere to measure the color over angle variations. In an imaging sphere the lighting assembly is placed in a half sphere such that the light is emitted towards the inner surface of the half sphere. There is also a sensor or camera provided that is able to detect at different points of the inner surface of the half sphere which light intensity impinges on the inner surface. Different points of the inner surface relate to different light emission directions and, as such, a color over angle variation profile can be constructed. In FIG. 4a series of measurement results are plotted for different lighting assemblies. In a single series of measurements, the color points of the light at different light emission angles is measured. These color points are drawn in the chart 400 as a point and consecutive points of one series of measurements are connected with each other with a line. When an analyzed lighting assembly has about no color over angle variation, all color points of one series of measurements are equal to each other—this would result in a single point in chart 400. When an analyzed lighting assembly has a relatively large color over angle variation, the points will be distributed over a relatively large area in the CIELUV color space.

Three series of measurements of the used CoB module without optical element can be found in chart 400 within ellipse 404. It is seen that the average color point of the emitted light is close to the black body line 402 and, thus, the emitted light is relatively white light. It can also be seen that the color points of the series are distributed along a relatively large area and, thus, that the CoB module without optical element has a relatively large color over angle variation.

Three series of measurements relate to a CoB module with an optical element as shown in FIG. 1 wherein the height of the channels is about 2 mm and the width of the channels is about 1.1 mm. The three series of measurements of this lighting assembly are located within ellipse 406. It is seen that the average color point is slightly shifted and it is seen that all the color points are located within a relatively small area and, thus, that the color over angle variation is relatively small. Ellipse 406 is much smaller than ellipse 404 and, thus, the color over angle variation has reduced significantly.

Three other series of measurement relate to a CoB module with an optical element as shown in FIG. 1 wherein the height of the channels is about 5 mm and the width of the channels is about 1 mm. The color points of these three series can be seen within ellipse 408. There is also a slight shift of the average color point and it can be seen that the color over angle variation is still smaller than for the CoB module without optical element, but is a little bit worse with respect to the used optical element with channels is about 2 mm and the width of the channels is about 1.1 mm.

Three further series of measurement relate to a CoB module with an optical element as shown in FIG. 1 wherein the height of the channels is about 5 mm and the width of the channels is about 3 mm. The color points of these three series can be seen within ellipse 410. There is also a slight shift of the average color point and it can be seen that the color over angle variation is still smaller than for the CoB module without optical element, but is a little bit worse with respect to the used optical element with channels is about 2 mm and the width of the channels is about 1.1 mm.

Thus, on basis of FIG. 4a it can be concluded that an optical element having a channel width in a range from 0.4 to 3.5 mm and heights in a range from 0.5 to 5.5 mm when provided on top of the specifically used CoB module reduces the color over angle variation of the light emitted by the CoB module. Optionally, the channels widths are in a range from 0.95 to 3.1 mm. Optionally, the channel widths are in a range from 0.95 to 1.2 mm. It can also be seen that a height in a range from 1.8 to 2.2 mm result in a good reduction of the color over angle variation.

Figure 4B:
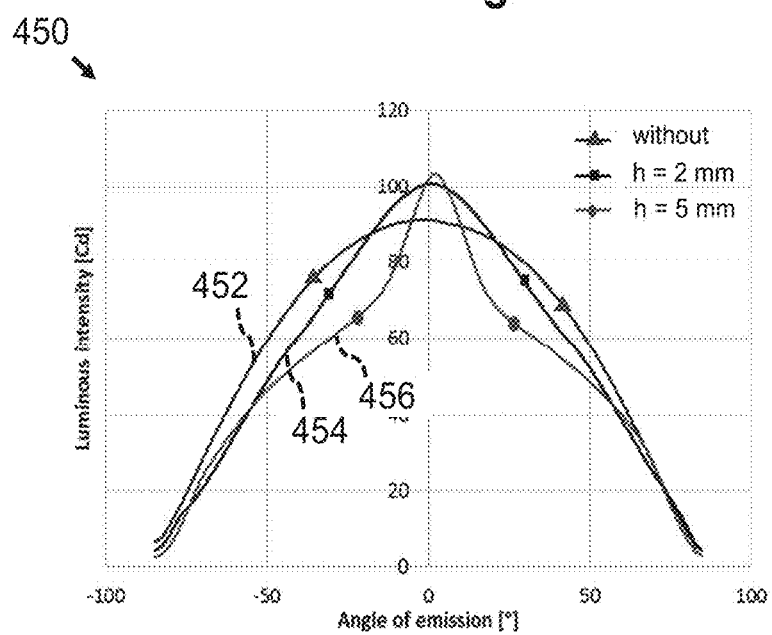
FIG. 4b shows a chart in which a collimation effect of the optical element is illustrated.

FIG. 4b shows a chart 450 in which a collimation effect of the optical element is illustrated. The x-axis represents the light emission angle and the y-axis represents a (normalized) luminous intensity emitted at the respective light emission angles. Curve 452 is obtained for the CoB module without optical element. Curve 454 is obtained for a CoB module with an optical element as presented in FIG. 1 and having channel heights of 2 mm. Curve 456 is obtained for a CoB module with an optical element as presented in FIG. 1 and having channel heights of 5 mm. The larger the channel widths are, the more the light is collimated. A channel height between 1.8 and 2.2 mm is an advantageous choice because it introduces a limited amount of collimation.

The inventors have also analyzed the photon efficiencies of different optical elements. It was seen that the photon efficiencies variated slightly in dependence of the color of light emitted by the light source. In the subsequent table the results are presented for different aspect ratios between the channel heights and the channel width.

TABLE 1

Photon efficiencies of optical elements with different channel dimensions measured in integrating sphere with a red and white LED source.

| Channel height/width | Aspect ratio | | | |
|---|---|---|---|---|
| | Red light | | White light | |
| | Low height | High height | Low height | High height |
| 2 mm/1 mm & 5 mm/3 mm | 92.0% | 89.3% | 90.4% | 88.5% |
| 5 mm/1 mm & 10 mm/3 mm | 85.1% | 84.9% | 83.3% | 82.6% |

It can be concluded from Table 1 that the photon efficiency drops when the channel height increases and that the photon efficiency is not much influenced when the aspect ratio remains about the same while the dimensions change.

All test results discussed above provide a bases for concluding that a ratio between the height and the width of the channels in a range from 1.65 to 3.3 provide a good color over angle variation. Optionally, the ratio between the height and the width of the channels is in a range from 1.65 to 2.3. Optionally, the ratio between the height and the width of the channels is in a range from 1.75 to 2.2.

Figure 5A:
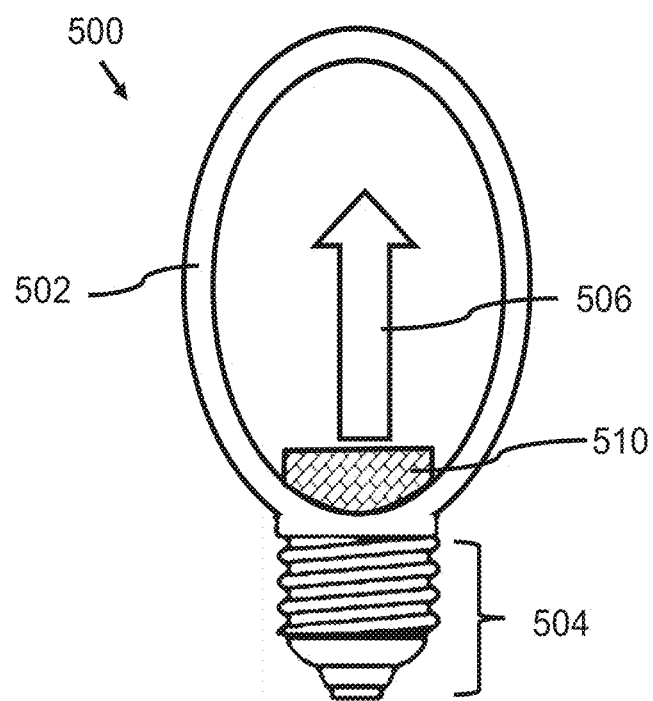
FIG. 5a shows an embodiment of a lamp.

FIG. 5a schematically shows in a cross-sectional view an embodiment of a retrofit light bulb 500. The retrofit light bulb 500 comprises a light transmitting bulb 502 that is provided on a base 504 that allows the retrofit light bulb to connect with a (power-)socket for a lamp in the same way as traditional light bulbs do. In the light transmitting bulb 502 is provided a lighting assembly 510 according to one of the previous discussed embodiments of the lighting assembly. The lighting assembly 510 emits light 506 that has a reduced color over angle variation compared to light that is emitted by the light source of the lighting assembly 510 only (and, thus, that is not provided with an optical element). In FIG. 5a it has been suggested that the lighting assembly 510 is present in the bulb 502 adjacent to the base 504, but the lighting assembly 510 may also be located at another location within the bulb 502.

Figure 5B:
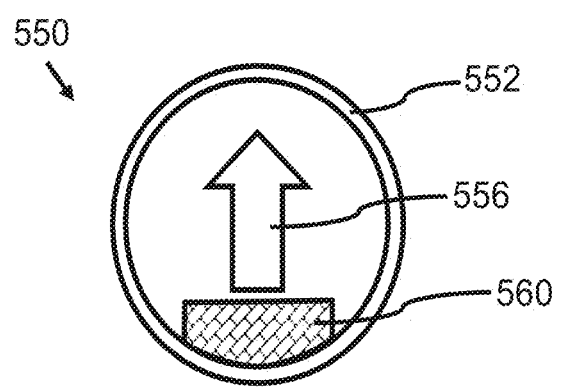
FIG. 5b shows another embodiment of a lamp.

FIG. 5b schematically shows in a cross-sectional view an embodiment of a retrofit light tube 550. The retrofit light tube 550 comprises a light transmitting tube 552 in which a lighting assembly 560 according to previously discussed embodiments is provided. The lighting assembly 560 emits light 506 that has a reduced color over angle variation compared to the light that is emitted by light source of the lighting assembly 510 and is not provided with an optical element. When the lighting assembly 560 comprises several light emitters/light sources and, for example, an elongated optical element, the lighting assembly may extend in the tube 552 in the longitudinal direction of the tube 552.

The retrofit light tube 550 and the retrofit light bulb 500 are examples of lamps that comprise the lighting assembly according to previously discussed embodiments.

Figure 6:
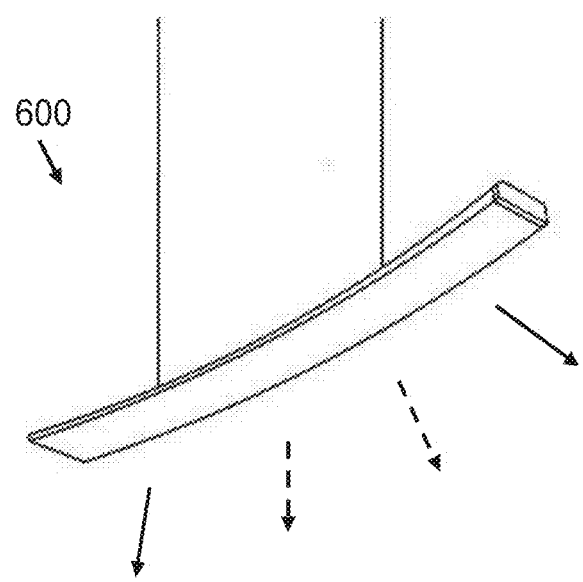
FIG. 6 shows an embodiment of a luminaire, FIG. 7a schematically shows an embodiment of a manufacturing method, FIG. 7b schematically shows an embodiment of a data carrier comprising a manufacturing control program, and FIGS. 8a to 8d schematically show top view of alternative embodiment of an optical element.

FIG. 6 schematically shows in a 3d view a luminaire 600. The luminaire 600 is provided with a lighting assembly according to one of the previously discussed embodiments of such a lighting assembly, a retrofit light bulb 500 as discussed in the context of FIG. 5a or a retrofit light tube 550 as discussed in the context of FIG. 5b.

Figure 7A:
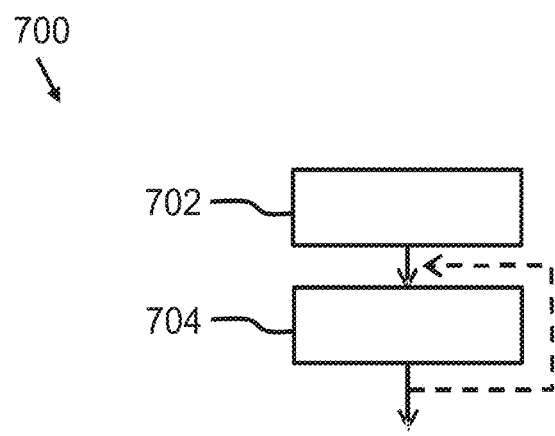

FIG. 7a schematically shows an embodiment of a manufacturing method 700. The manufacturing method 700 is to manufacture an optical element for use in embodiments of the lighting assembly (as discussed above). The optical element being arranged for reducing a color over angle variation of the light emitted by the light emission window of the luminescent element. The optical element comprises a light input face, a light output face and at a plurality of locations a light transmitting wall extending from the light input face to the light output face. The manufacturing method 700 is based on additive manufacture and comprises i) depositing 702 with an additive manufacturing apparatus a first layer of the wall at the different locations, wherein a light transmitting material is deposited, ii) depositing 704 with the additive manufacturing apparatus a subsequent layer of the walls of the optical element on top of a previously deposited layer, wherein the light transmitting material is deposited and the depositing of the subsequent layer is repeated until a predefined height of the wall is reached and consequently the optical element is obtained, the height being measured along the wall along a shortest path from the light input face towards the light output face. It is to be noted that, in an embodiment, one may read 3d printing instead of additive manufacturing.

Figure 7B:
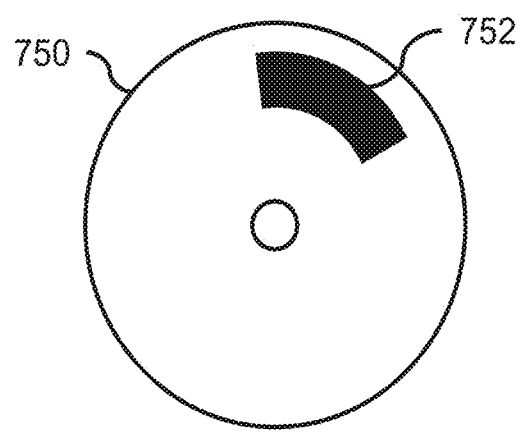

FIG. 7b schematically shows an embodiment of a data carrier 750 comprising a manufacturing control program 752. The manufacturing method 700 may be implemented on a computer as a computer implemented method, as dedicated hardware, or as a combination of both. As also illustrated in FIG. 7b, instructions for the computer, e.g., executable code, may be stored on a computer readable medium 750, e.g., in the form of a series 752 of machine readable physical marks and/or as a series of elements having different electrical, e.g., magnetic, or optical properties or values. The executable code may be stored in a transitory or non-transitory manner. Examples of computer readable mediums include memory devices, optical storage devices, integrated circuits, servers, online software, etc. FIG. 7b shows an optical disc 750. The carrier of the manufacturing control program may be any entity or device capable of carrying the program. For example, the carrier may include a data storage, such as a ROM, for example, a CD ROM or a semiconductor ROM, or a magnetic recording medium, for example, a hard disk. Furthermore, the carrier may be a transmissible carrier such as an electric or optical signal, which may be conveyed via electric or optical cable or by radio or other means. When the program is embodied in such a signal, the carrier may be constituted by such a cable or other device or means. Alternatively, the carrier may be an integrated circuit in which the program is embedded, the integrated circuit being adapted to perform, or used in the performance of, the relevant method.

In summary, this document provides a lighting assembly, a lamp, a luminaire, a manufacturing method and a manufacturing control program. The lighting assembly comprises a light source and an optical element. The light source comprises a solid state light emitter and a luminescent element. The solid state light emitter is arranged to emit light of a first color into the luminescent element. The luminescent element comprises a light emission window through which the light is emitted. The optical element is arranged for reducing a color over angle variation of the light emitted by the light emission window of the luminescent element. The optical element comprises a light input face, a light output face and at a plurality of locations a light transmitting wall extending from the light input face to the light output face.

It will be appreciated that the above description for clarity has described embodiments of the invention with reference to different functional units and, when referring to the additive manufacturing technology, different processors. However, it will be apparent that any suitable distribution of functionality between different functional units or processors may be used without deviating from the invention. For example, functionality illustrated to be performed by separate units, processors or controllers may be performed by the same processor or controllers. Hence, in all embodiments references to specific functional units are only to be seen as references to suitable means for providing the described functionality rather than indicative of a strict logical or physical structure or organization. The invention can be implemented in any suitable form including hardware, software, firmware or any combination of these.

It is noted, that in this document the word 'comprising' does not exclude the presence of other elements or steps than those listed and the word 'a' or 'an' preceding an element does not exclude the presence of a plurality of such elements, that any reference signs do not limit the scope of the claims, that the invention may be implemented by means of both hardware and software, and that several 'means' or 'units' may be represented by the same item of hardware or software, and a processor may fulfill the function of one or more units, possibly in cooperation with hardware elements. Further, the invention is not limited to the embodiments, and the invention lies in each and every novel feature or combination of features described above or recited in mutually different dependent claims.

The invention claimed is:

1. A lighting assembly comprising
a light source comprising a solid state light emitter and a luminescent element, the solid state light emitter being arranged to emit light of a first color into the luminescent element, the luminescent element comprising luminescent material for absorbing a portion of the light of the first color and for converting a portion of the absorbed light towards light of a second color, the luminescent element comprising a light emission window through which the light of one or more of the first color and the second color is emitted,
an optical element arranged for reducing a color over angle variation of the light emitted at the light emission window of the luminescent element, the optical element comprising a light input face, a light output face and at a plurality of locations a light transmitting wall extending from the light input face to the light output face, the light input face facing the light emission window of the luminescent element for receiving light emitted by the luminescent element, the light output face being arranged opposite to the light input face for emitting transmitted light into an ambient of the lighting assembly,
wherein said walls at the plurality of locations are arranged to reflect in between 5% and 20% of the light that impinges on said walls.

2. The lighting assembly according to claim 1, wherein the optical element comprises a channel structure wherein light transmitting channel walls enclose channels, a first end of the channels are arranged at the light input face and a second opposite end of the channels are arranged at the light output face, at the plurality of locations the light transmitting wall being formed by the light transmitting channel walls.

3. The lighting assembly according to claim 2, wherein cross-sectional shapes of the channels are selected from: a triangle, a square, a rectangle, a circle, an ellipse, and a polygon having multiple equal angles and/or multiple equal edges.

4. The lighting assembly according to claim 1, wherein the light transmitting wall at the plurality of location is formed by a spiraling wall that has a cross-section shape of a spiral in a plane parallel to the light input face or to the light output face.

5. The lighting assembly according to claim 1, wherein said walls at the plurality of locations are made of a transparent material.

6. The lighting assembly according to claim 1, wherein a surface of said walls that extends from the light input face to the light output face has a relief, optionally the relief being formed by ribs extending in planes about parallel to the light input face or light output face.

7. The lighting assembly according to claim 1, wherein a surface of said walls at the plurality of locations has a structure being the result of an additive manufacturing technology.

8. The lighting assembly according to claim 1, wherein said walls at the plurality of locations comprise at least one of the subsequent materials, or blends and copolymers of the subsequent materials: a polyolefin such as for example polypropylene, a polyester such as for example Polyethylene terephthalate, an acrylate such as for example Poly(methyl methacrylate), a polycarbonate such as for example bisphenol-A polycarbonate, polystyrene, Acrylonitrile butadiene styrene, polylactic acid.

9. The lighting assembly according to claim 1, wherein
said walls at the plurality of locations have a height (h) being defined as a shortest distance from the light input face to the light output face, wherein said heights (h) are in a range from 0.5 to 5.5 mm or, optionally, said heights are in a range from 0.8 to 1.2 mm, and
when each channel has a width (w, w1, w2), the width (w, w1, w2) being defined in radial direction of the channel and is a shortest distance from a point on said channel wall towards an opposite point on said channel wall, wherein said width (w, w1, w2) of the channels are in a range from 0.4 to 3.5 mm, or, optionally, said width (w, w1, w2) of the channels are in a range from 1.8 to 2.2 mm.

10. The lighting assembly according to claim 9, wherein a ratio between the height (h) and the width (w, w1, w2) of the channels is in a range from 1.65 to 2.3.

11. A lamp comprising the lighting assembly according to claim 1.

12. A luminaire comprising the lighting assembly according to claim 1.

* * * * *